(12) United States Patent
Lambrache

(10) Patent No.: US 7,336,109 B2
(45) Date of Patent: Feb. 26, 2008

(54) HIGH VOLTAGE TOLERANT PORT DRIVER

(75) Inventor: Emil Lambrache, Campbell, CA (US)

(73) Assignee: Atmel Corporation, San Jose, CA (US)

( * ) Notice: Subject to any disclaimer, the term of this patent is extended or adjusted under 35 U.S.C. 154(b) by 148 days.

(21) Appl. No.: 11/261,698

(22) Filed: Oct. 28, 2005

(65) Prior Publication Data

US 2007/0096779 A1 May 3, 2007

(51) Int. Cl.
*H03B 1/00* (2006.01)

(52) U.S. Cl. .................................. 327/112; 327/108

(58) Field of Classification Search ............... None
See application file for complete search history.

(56) References Cited

U.S. PATENT DOCUMENTS

| | | | | |
|---|---|---|---|---|
| 4,906,870 A | | 3/1990 | Gongwer ................... 307/465 |
| 5,182,810 A | | 1/1993 | Bartling et al. ............. 395/750 |
| 5,469,082 A | * | 11/1995 | Bullinger et al. ............. 326/81 |
| 5,570,043 A | | 10/1996 | Churchill ..................... 326/81 |
| 5,583,454 A | * | 12/1996 | Hawkins et al. .............. 326/81 |
| 5,905,618 A | * | 5/1999 | Cases et al. ................... 361/88 |
| 5,988,819 A | | 11/1999 | Shieh et al. ................. 357/537 |
| 6,040,708 A | * | 3/2000 | Blake et al. .................... 326/33 |
| 6,313,671 B1 | | 11/2001 | Le et al. ..................... 327/112 |
| 6,388,469 B1 | * | 5/2002 | Hunt et al. ..................... 326/81 |
| 6,583,646 B1 | * | 6/2003 | Patel et al. ..................... 326/80 |
| 6,633,470 B2 | | 10/2003 | Ponton et al. ............. 361/91.1 |
| 6,654,310 B2 | * | 11/2003 | Nam ...................... 365/230.06 |
| 6,809,574 B1 | | 10/2004 | Kiani ......................... 327/538 |
| 6,859,074 B2 | | 2/2005 | Ajit ............................. 327/108 |
| 6,922,092 B2 | * | 7/2005 | Stark et al. .................. 327/170 |
| 6,963,218 B1 | * | 11/2005 | Alexander et al. ............ 326/30 |
| 2002/0021144 A1 | | 2/2002 | Morgan et al. ............... 326/57 |

* cited by examiner

*Primary Examiner*—Cassandra Cox
(74) *Attorney, Agent, or Firm*—Schneck & Schneck; Thomas Schneck

(57) ABSTRACT

A plurality of output drive devices are capable of tolerating an overvoltage produced by an electrical connection with an external device operating in a high-voltage supply realm. The drive devices are capable of sustaining a continuous electrical connection to the elevated voltage levels and produce communications at an output voltage level equal to the supply voltage indigenous to the device. A high-voltage tolerant driver includes a plurality of output drive devices capable of tolerating an overvoltage, sustaining an electrical connection to an elevated voltage level, and producing an output voltage at an indigenous supply level. An initial pullup drive circuit is coupled to the plurality of output drive devices and produces an initial elevated drive voltage to the plurality of output drive devices. A sustain pullup circuit is coupled to the plurality of output drive devices and produces a sustained output voltage at the indigenous supply level.

6 Claims, 4 Drawing Sheets

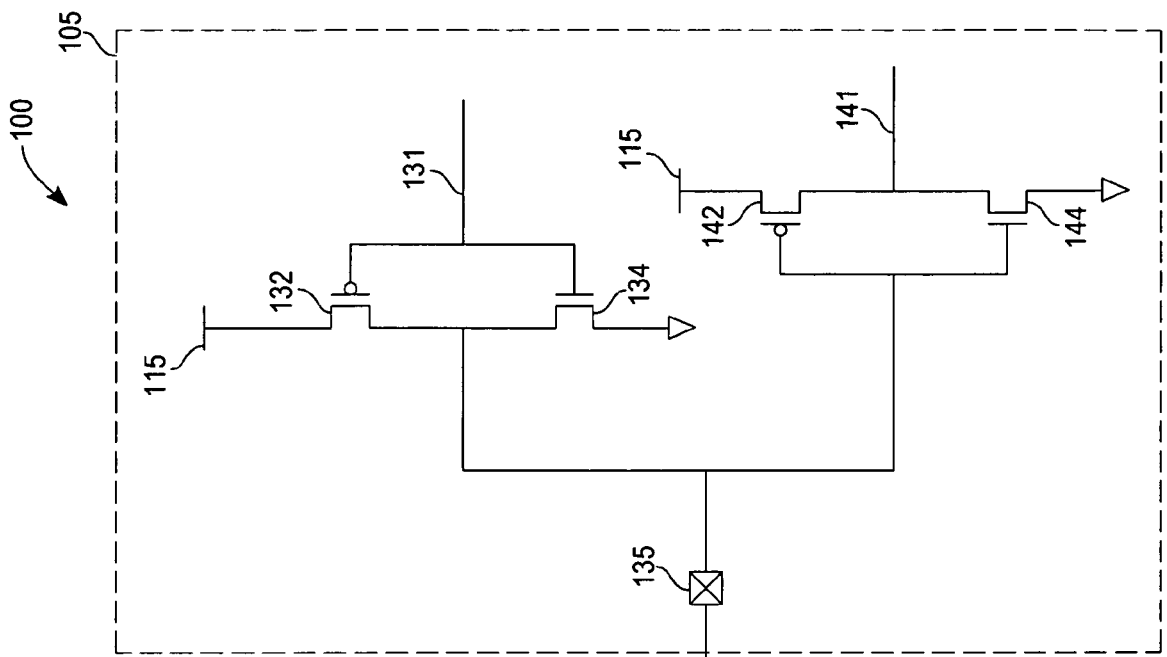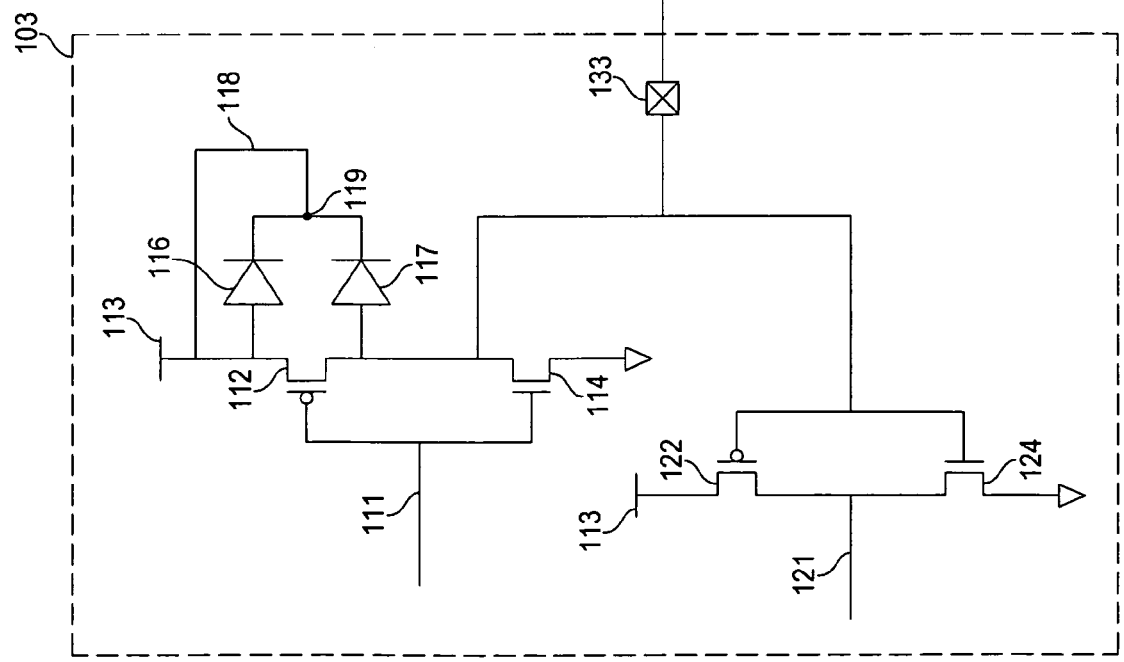
Fig._1
(Prior Art)

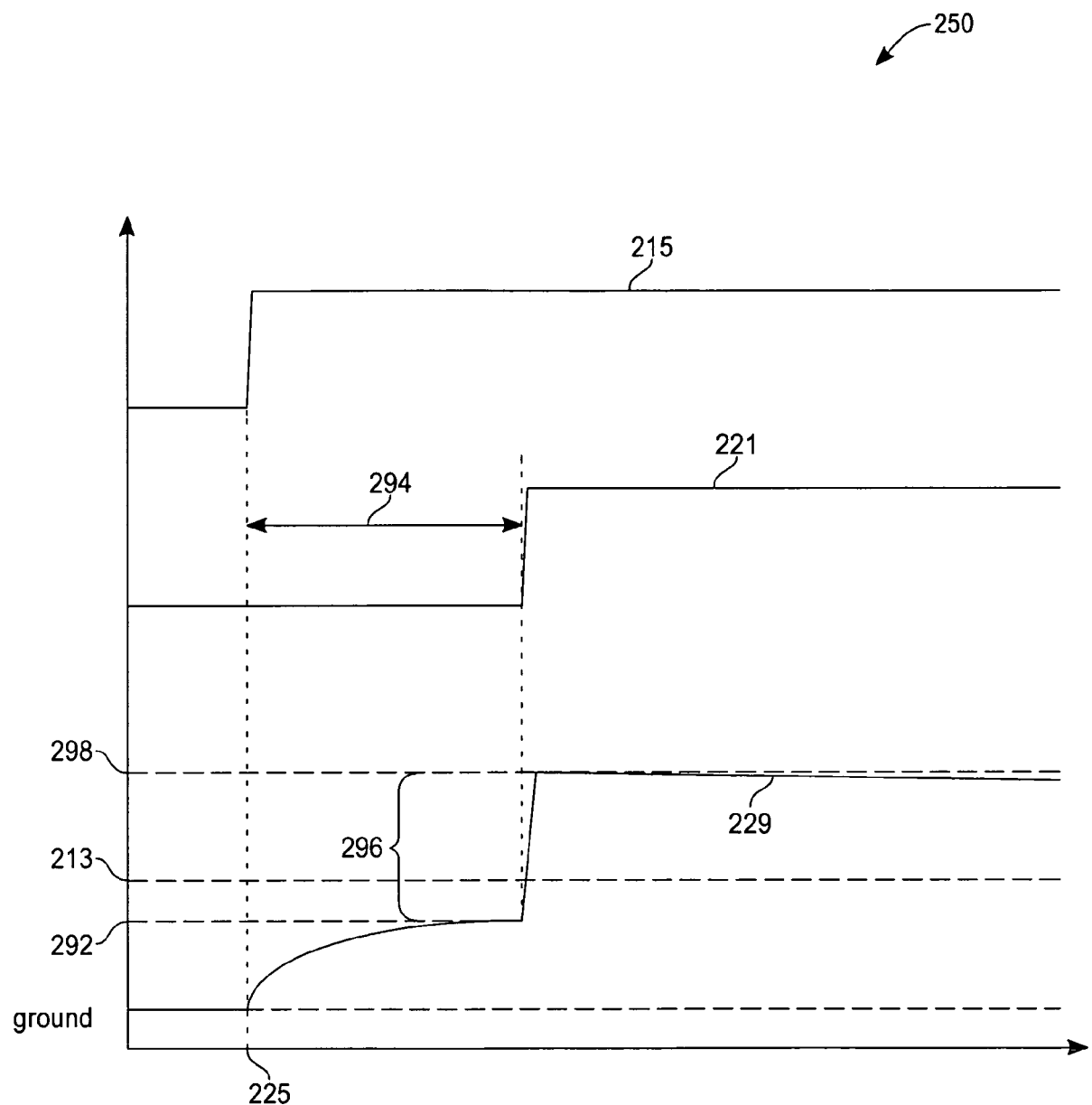
Fig._2b

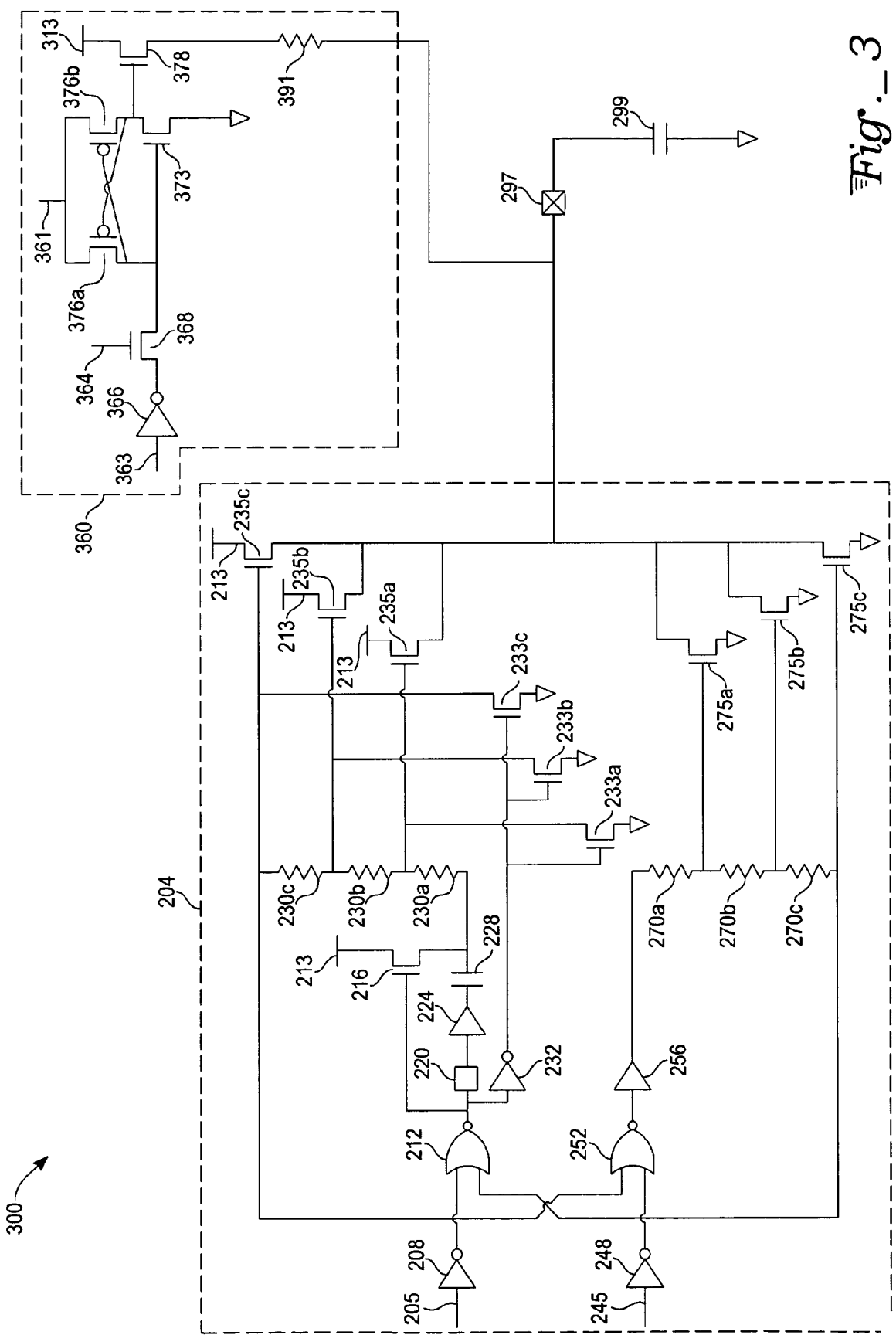
Fig._3

HIGH VOLTAGE TOLERANT PORT DRIVER

TECHNICAL FIELD

The present invention relates to bidirectional port drivers. More specifically, the present invention relates to port drivers tolerant of operating environments requiring an interface with voltages higher than the power supply of the circuit containing the port driver.

BACKGROUND ART

In electronic systems, subsystem building blocks are frequently implemented in separate integrated circuit devices. To communicate with one another, the building blocks have I/O pads interconnected with one another. In the evolution of integrated circuit fabrication processes, the operating voltages have progressively diminished. In interconnecting subsystem building blocks, integrated circuit devices operating at different supply voltages will be connected by their I/O pads. Across the interconnects of the various integrated circuit devices various combinations of voltages will interact as high logic level signals are communicated.

Generally there is no problem for a device with a lower supply voltage driving a device operating from a higher supply voltage. Additionally, there is typically no problem with the higher supply voltage level being applied to a tristated pulldown only device in the lower supply voltage realm. A problem arises in a CMOS integrated circuit technology when a tristated PMOS pullup device in a low supply voltage realm is driven to a high logic level by a device in a high supply voltage realm.

With reference to FIG. 1, a 3 volt (V) realm 103 connects to a 5 V realm 105 in a schematic diagram of a prior art interconnect network 100 with mixed supply voltages. A 3 V output pullup device 112 connects between a 3 V supply 113, a 3 V input 111, and a 3 V I/O pad 133. A source-substrate diode 116 and a drain-substrate diode 117 connect in parallel from the source and drain respectively of the 3 V output pullup device 112 to a 3 V pullup substrate node 119. A source-substrate connection 118 connects between the 3 V pullup substrate node 119 and the 3 V supply 113. A 3 V output pulldown device 114 connects between the 3 V input 111, the 3 V output pullup device 112, the 3 V I/O pad 133, and ground.

A 3 V input pullup device 122 connects between a 3 V output 121, the 3 V supply 113, and the 3 V I/O pad 133. A 3 V input pulldown device 124 connects between the 3 volt output 121, the 3 V input pullup device 122, the 3 V I/O pad 133, and ground.

A 5 V output pullup device 132 connects between a 5 V supply 115, a 5 V input 131, and a 5 V I/O pad 135. A 5 V output pulldown device 134 connects between the 5 V input 131, the 5 V output pullup device 132, the 5 V I/O pad 135, and ground.

A 5 V input pullup device 142 connects between a 5 V output 141, the 5 V supply 115, and the 5 V I/O pad 135. A 5 V input pulldown device 144 connects between the 5 V output 141, the 5 V input pullup device 142, the 5 V I/O pad 135, and ground.

The output of the 3 V output pullup device 112, when tristated, presents a p-n diode connection, in the form of the drain-substrate diode 117, from an output drain diffusion to substrate. Even though the 3 V output pullup device 112, is a tristated PMOS FET, the high logic level from the 5 V realm 105 will conduct through the diode and cause high current and possibly latchup conditions that may damage the 3 V realm 103 device.

In an effort to solve problems with high input bias levels applied to input diffusions and substrates, previous port drivers have incorporated complex networks for switching substrate biasing to protective voltage levels. What is needed is a port driver operating in a low-voltage realm that is tolerant of high voltages applied from external system devices without a burden of incorporating complex networking for switching the biasing of the substrate. Additionally, such a low-voltage realm port driver ideally drives a high logic level output to the full supply level of the indigenous voltage realm.

SUMMARY

A plurality of output drive devices are capable of tolerating an overvoltage produced by an electrical connection with an external device operating in a high supply voltage realm. The plurality of output drive devices are capable of sustaining a continuous electrical connection to the elevated voltage levels and produce communications at an output voltage level equal to the supply voltage indigenous to the device. The plurality of output drive devices maintain communications to the high supply voltage realm without sustaining damage and without allowing high currents to damage the device. An initial NMOS pullup drive circuit is connected to the plurality of output drive devices and produces an initial elevated drive voltage that allows the plurality of output drive devices to attain an output drive level at the full supply voltage. The initial NMOS pullup drive circuit contains delay elements operating in sequence that provide a staggering of the initial elevated drive voltage providing slew rate control at the output. A sustaining NMOS pullup circuit connects to the plurality of output drive devices and produces a continuous output drive voltage for maintaining output signaling at the full supply voltage.

BRIEF DESCRIPTION OF DRAWINGS

FIG. 1 is a schematic diagram of a prior art interconnect network with mixed supply voltages.

FIG. 2b is a waveform diagram of initial response driving signals corresponding to the exemplary high voltage tolerant port driver of FIG. 2a.

FIG. 3 is a schematic diagram of an exemplary high voltage tolerant port driver with a further exemplary sustain circuit.

DETAILED DESCRIPTION

Figure 2A:
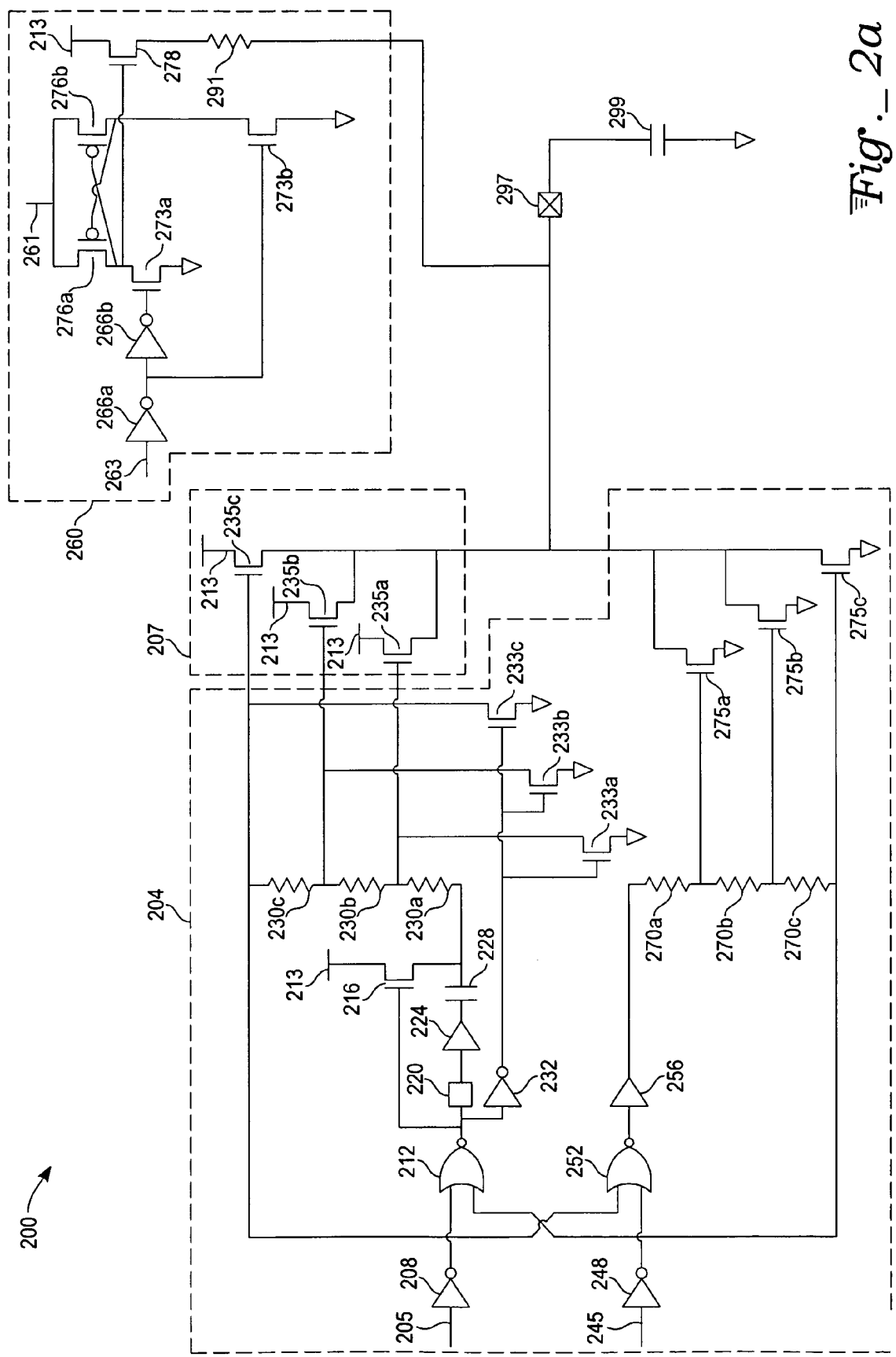
FIG. 2a is a schematic diagram of an exemplary high voltage tolerant port driver.

With reference to FIG. 2a, a pullup/pulldown circuit 204 connects to an I/O pad 297 in an exemplary high voltage tolerant port driver 200. The pullup/pulldown circuit 204 is driven by a pullup enable input 205 and a pulldown enable input 245. The pullup enable input 205 connects to a pullup enable inverter 208. The pullup enable inverter 208 connects to a first input of a pullup NOR gate 212. The pullup NOR gate 212 connects to a control input of an NMOS pullup device 216, a delay block 220, and a pulldown inverter 232. The delay block 220 connects to a pullup buffer 224 which connects to an input of a capacitor 228. An output of the capacitor 228 connects to an output of the NMOS pullup device 216 and to a first pullup slew rate resistor 230a. A second input of the NMOS pullup device 216 is connected to a low-voltage supply 213. An output of the pulldown inverter 232 connects to each control input of a plurality of input pulldown devices 233a, 233b, 233c.

A plurality of pull up slew rate resistors 230a, 230b, 230c connect to the output of the capacitor 228. Each output of the plurality of pullup slew rate resistors 230a, 230b, 230c connects to a corresponding control input of one of a plurality of NMOS output drive devices 207 and a corresponding second input of each the plurality of input pulldown devices 233a, 233b, 233c.

A pulldown enable inverter 248 connects to the pulldown enable input 245 and to a first input of a pulldown NOR gate 252. An output of a last pull up slew rate resistor 230c connects to a second input of the pulldown NOR gate 252. A pulldown buffer 256 connects to an output of the pulldown NOR gate 252 and an input of a first pulldown slew rate resistor 270a. A plurality of pulldown slew rate resistors 270a, 270b, 270c connects between the output of the pulldown buffer 256 and a second input of the pullup NOR gate 212. Each output of the plurality of pulldown slew rate resistors 270a, 270b, 270c connects to a respective control input of one of a plurality of NMOS output pulldown devices 275a, 275b, 275c. Each one of the plurality of NMOS output pulldown devices 275a, 275b, 275c connects in parallel between an output of the pullup/pulldown circuit 204 and ground.

A first pullup sustain inverter 266a connects between a pullup sustain input 263 of a sustain circuit 260, an input of a second pullup sustain inverter 266b, and a control input of a second NMOS sustain pulldown device 273b. A first PMOS sustain pullup device 276a and a second PMOS sustain pullup device 276b are cross-coupled to one another and each device has a first input connected to a pump voltage input 261. A first NMOS sustain pulldown device 273a is connected at a control input to an output of the pullup sustain inverter 266b and at a second input to the first PMOS sustain pullup device 276a and a control input of a third NMOS sustain pullup device 278. The second NMOS sustain pulldown device 273b connects between an output of the second PMOS sustain pullup device 276b and ground. The third NMOS sustain pullup device 278 connects between the low-voltage supply 213 and a pullup resistor 291. The pullup resistor 291 connects to an I/O pad 297. The I/O pad 297 connects to a capacitive load 299.

The plurality of NMOS output drive devices 207 is comprised of, for example, a plurality of NMOS output pullup devices 235a, 235b, 235c. The plurality of NMOS output pullup devices 235a, 235b, 235c connect in parallel between the low-voltage supply 213 and the I/O pad 297.

With reference to FIG. 2b and in continuing reference to FIG. 2a, a rising edge of a Drive_up signal 215 is applied to the pullup enable input 205 at $t_0$ (time zero) 225 in an exemplary initial response driver waveform diagram 250. To propagate a high logic level to the I/O pad 297, the positive-going edge of the Drive_up signal 215 is applied to the pullup enable input 205 and propagates through the pullup enable inverter 208. The positive-going edge becomes a low-level signal input to the pullup NOR gate 212 and causes a high-level signal at the control input of the NMOS pullup device 216. The output of the NMOS pullup device 216 produces a drive gate signal 229 at the control inputs of the plurality of NMOS output drive devices 207. The NMOS pullup device 216, an NMOS FET device, raises the drive gate signal 229 to the threshold limit voltage 292 which is, for example, one NMOS FET device threshold below the voltage on the low-voltage supply 213.

The high voltage level at the output of the NMOS pullup device 216 is applied to the first pullup slew rate resistor 230a. The output of the first pullup slew rate resistor 230a will pull up the control input to a first NMOS output pullup device 235a. The series resistance of the first pullup slew rate resistor 230a and the capacitance of the gate of the first NMOS output pullup device 235a produce an integrating effect on the drive gate signal 229 immediately after $t_0$ 225 known as slew rate control. The same effect is experienced at each succeeding combination of pullup slew rate resistor 205b, 205c and control input of each NMOS output pullup device 235b, 235c until the threshold limit voltage 292 is attained.

The plurality of NMOS output pullup devices 235a, 235b, 235c is configured as source follower transistors. Due to body effect, the gate-to-source component of the input capacitance of each one of the plurality of NMOS output pullup devices 235a, 235b, 235c is about one third the magnitude of the gate-to-source capacitance of each one of the plurality of NMOS output pulldown devices 275a, 275b, 275c. For a balanced slew rate control in both a pull-up and a pull-down transition, the resistance of the plurality of pull up slew rate resistors 230a, 230b, 230c is selected to be three times the magnitude of the resistance of the plurality of pulldown slew rate resistors 270a, 270b, 270c.

Signal transitions (not shown) resulting from the rising edge of the Drive_up signal 215 propagate through the delay block 220 and produce a corresponding rising edge on a Delay_up signal 221 after a boost delay time 294. The Delay_up signal 221 is produced by the pullup buffer 224 and applied to the input of the capacitor 228. The Delay_up signal 221 produces a boost voltage 296 at the output of the capacitor 228 elevating the Drive_gate signal 229 to a drive gate voltage 298 which is higher than the low-voltage supply 213. The drive gate voltage 298 applied to the control inputs of the plurality of NMOS output drive devices 207 is a sufficient voltage to elevate the voltage at an output of the plurality of NMOS output drive devices 207 to the voltage of the low-voltage supply 213. The boost voltage 296 produced by the Delay_up signal 221 is applied to the capacitor 228 and sustains the drive gate voltage 298 for a finite amount of time as losses discharge the capacitor 228.

A value C of the capacitor 228 is based on an expression derived from an analysis of a network at an interface of the capacitor 228 to the plurality of NMOS output drive devices 207. The expression $$\frac{\Delta_r \times g_m}{C + C_{gs}} = \ln\frac{\Delta_r \times g_m}{C_{gs}}$$

can be solved for the value C of the capacitor 228, where $\Delta_r$ is the boost delay time 294, $C_{gs}$ is a gate-to-source component of input capacitance of the plurality of NMOS output drive devices 207, and $g_m$ is the gain of the plurality of NMOS output drive devices 207. The value of the capacitor 228 is about, for example, 0.8 pF.

The boost delay time 294, $\Delta_r$, is selected to allow enough time for the capacitor 228 to charge up to an effective voltage to drive the plurality of NMOS output drive devices 207, yet not so long as to detract from the overall circuit delay. The plurality of NMOS output drive devices 207 is configured as source follower transistors. Due to body effect, the input capacitance is not the sum of each individual gate-to-source capacitance where a source node is connected to ground. A source node of each device varies in voltage with the change in voltage on the I/O pad 297. An effective input gate capacitance $C_x$ of the plurality of NMOS output drive devices 207 is less than a gate-to-source capacitance $C_{gs}$ of the NMOS output drive devices 207 if the respective source nodes are connected to ground.

Using the effective input gate capacitance $C_x$, the magnitude of the boost voltage 296 is given by $$Vcc \times \frac{C}{C+C_x}.$$

The drive gate voltage 298 attained is given by $$(V_{CC} - V_{Tn}) + Vcc \times \frac{C}{C+C_x},$$

where $V_{Tn}$ is the NMOS device threshold of the plurality of NMOS output drive devices 207.

To provide a continuing high-level voltage at the I/O pad 297, a low-level enable signal (not shown) is applied to the pullup sustain input 263 of the sustain circuit 260. The low-level enable signal produces a high-level signal from the output of the first pullup sustain inverter 266a to the control input of the second NMOS sustain pulldown device 273b and a low-level signal from the output of the second pullup sustain inverter 266b to the control input of the first NMOS sustain pulldown device 273a. The second NMOS sustain pulldown device 273b is turned on and the first NMOS sustain pulldown device 273a is turned off allowing the cross-coupled combination of the first PMOS sustain pullup device 276a and the second PMOS sustain pullup device 276b to apply a pump level voltage (not shown) to the control input of the third NMOS sustain pullup device 278. The pump level voltage is applied to the pump voltage input 261 and is produced by a separate charge pump (not shown). The pump level voltage turns the third NMOS sustain pullup device 278 on, connecting the low-level supply 213 to the pullup resistor 291 and producing a full-level voltage from the low-voltage supply 213. No device threshold drop is present in the output voltage on the I/O pad 297 due to the pump level voltage on the control input of the third NMOS sustain pullup device 278.

Prior to to 225, no signal transition is driven to the I/O pad 297 and a condition exists where a low logic level is applied to both the pullup enable input 205 and the pulldown enable input 245. The application of the low logic level to both inputs causes the pullup/pulldown circuit 204 to be tristated. The low logic level applied to both the pullup enable input 205 and the pulldown enable input 245 produces a high-level signal at the control inputs of the plurality of input pulldown devices 233a, 233b, 233c and a low-level signal at the control inputs of the plurality of NMOS output pulldown devices 275a, 275b, 275c. The low-level signal at the control inputs of the plurality of NMOS output pulldown devices 275a, 275b, 275c turns the devices off and produces a high impedance path from the I/O pad 297 to ground. The high-level signal at the control inputs of the plurality of input pulldown devices 233a, 233b, 233c turns the devices on, pulling down the control inputs to the plurality of NMOS output drive devices 207 and produces a high impedance path from the I/O pad 297 to the low-voltage supply 213.

Thus, the I/O pad is tristated from the output coming from the pullup/pulldown circuit 204 and the plurality of NMOS output drive devices 207.

With reference to FIG. 3, a pullup/pulldown circuit 204 connects to an I/O pad 297 in an exemplary high voltage tolerant port driver 300 with a further exemplary sustain circuit 360. The pullup/pulldown circuit 204 operates as explained, supra, with reference to FIG. 2a. A first pullup sustain inverter 366 connects between a pullup sustain input 363 of the sustain circuit 360 and a first input of a sustain pass gate 368. A sustain pass gate input 364 connects to the control input of the sustain pass gate 368. A first PMOS sustain pullup device 376a and a second PMOS sustain pullup device 376b are cross-coupled to one another and each device has an input connected to a pump voltage input 361.

A control input of an NMOS sustain pulldown device 373 connects to an output of the sustain pass gate 368 and an output of the first PMOS sustain pullup device 376a. A control input of a third NMOS sustain pullup device 378 connects to an output of the second PMOS sustain pullup device 376b and a second input of the NMOS sustain pulldown device 373. The third NMOS sustain pullup device 378 connects between the low-voltage supply 313 and a pullup resistor 391. The pullup resistor 391 connects to the I/O pad 297. The I/O pad 297 connects to the capacitive load 299.

With reference to FIGS. 2 and 3, a separate high-voltage supply connects to the I/O pad 297 in operation and produces a high voltage on the a low-voltage reverse biased drain-substrate diode (not shown) at the output of the plurality of NMOS output pulldown devices 275a, 275b, 275c or the source-substrate diode (not shown) at the output of the plurality of NMOS output drive devices 207. As discussed, supra, with reference to FIG. 1, the application of an externally supplied high voltage to a pulldown (NMOS) device is not critical. The plurality of NMOS output drive devices 207 and each one of the plurality of NMOS output pullup devices 235a, 235b, 235c in a tristate condition, functions as a reversed biased diode between the I/O pad 297 and ground. The pullup/pulldown circuit 204 and the accompanying low-voltage domain are protected from overvoltage of a magnitude typical of mixed interface voltages in a system environment. The overvoltage protection is due to the presence of the reverse bias diodes at both the pullup and the pulldown output. In this way, the low-voltage realm connecting to the high voltage tolerant port driver is protected from latchup and damage due to typical overvoltage experienced in system operation.

Although the present invention has been described in terms of specific exemplary embodiments, a skilled artisan will recognize that certain changes and modifications can be made and still be within a scope of the appended claims. For example, the pullup/pulldown transistors described are MOS devices which may readily be replaced by other transistor types or tristatable devices. The specification and drawings are, accordingly, to be regarded in an illustrative rather than a restrictive sense.

What is claimed is:

1. A driver comprising:
 a plurality of output drive devices capable of tolerating an overvoltage, sustaining an electrical connection to an elevated voltage level, and producing an output voltage at a supply voltage level;
 an initial pullup drive circuit coupled to the plurality of output drive devices and capable of producing an initial elevated drive voltage with slew rate control to the plurality of output drive devices; and a sustain pullup circuit coupled to the plurality of output drive devices and capable of producing a sustained output voltage at the supply voltage level.

2. A driver comprising:

an output means for producing an output voltage at a supply voltage level, sustaining an electrical connection to an elevated voltage level, and tolerating an overvoltage;

an initial pullup means, incorporating delay devices, for producing an initial elevated drive voltage to the output means with slew rate control; and a sustain pullup means for producing a sustained output voltage at the supply voltage level.

3. The driver as in claim 1, wherein the plurality of output drive devices comprise a plurality of NMOS output pullup drive devices connected in parallel between the supply voltage level and an output pad, each of the pullup drive devices having a control input coupled to the initial pullup drive circuit to receive the initial elevated drive voltage with the slew rate control.

4. The driver as in claim 1, wherein the initial pullup drive circuit comprises a pullup enable logic gate with an output connected to a delay block and a control input of a NMOS pullup device, the delay block coupled through a buffer to an input of a capacitor, and the output of the capacitor connects to an output of the NMOS pullup device.

5. The driver as in claim 4, wherein the output of the NMOS pullup device is connected to a plurality of pullup slew rate resistors connected in series, outputs from each of the slew rate resistors providing the initial elevated drive voltage with slew rate control.

6. The driver as in claim 1, wherein the sustain pullup circuit comprises a sustain pullup device and a sustain resistor connected in series between the supply voltage level and an output pad, the sustain pullup device having a control input connected to a cross-coupled pair of sustain pullup devices so as to receive a pump voltage therethrough whenever a pullup sustain input signal is received by the cross-coupled pair.

* * * * *

UNITED STATES PATENT AND TRADEMARK OFFICE
CERTIFICATE OF CORRECTION

PATENT NO. : 7,336,109 B2 Page 1 of 1
APPLICATION NO. : 11/261698
DATED : February 26, 2008
INVENTOR(S) : Lambrache It is certified that error appears in the above-identified patent and that said Letters Patent is hereby corrected as shown below:

In column 5, line 49, after "Prior to" delete "to" and insert -- $t_0$ --, therefor.

Signed and Sealed this

First Day of July, 2008

JON W. DUDAS
*Director of the United States Patent and Trademark Office*